United States Patent [19]

Schulte et al.

[11] Patent Number: 4,783,594

[45] Date of Patent: Nov. 8, 1988

[54] RETICULAR DETECTOR ARRAY

[75] Inventors: Eric F. Schulte, Santa Barbara; Ichiro Kasai, Solvang, both of Calif.

[73] Assignee: Santa Barbara Research Center, Goleta, Calif.

[21] Appl. No.: 123,426

[22] Filed: Nov. 20, 1987

[51] Int. Cl.$^4$ .................. H01L 25/00; G01T 1/22; G01T 1/24

[52] U.S. Cl. .................. 250/370.08; 250/332; 357/30

[58] Field of Search .......... 250/370, 371, 330, 331, 250/332, 333, 334, 352; 357/29, 30, 31, 32

[56] References Cited

U.S. PATENT DOCUMENTS 4,087,687  5/1978  Bean ............................ 250/331

Primary Examiner—Eugene R. LaRoche
Assistant Examiner—David Mis
Attorney, Agent, or Firm—W. C. Schubert; V. G. Laslo; A. W. Karambelas

[57] ABSTRACT

A detector assembly for reception of infrared radiation is formed as a composite structure of a detector array electrically connected by a set of contacts to a readout chip disposed on a backside of the assembly opposite a front side receiving incident radiation. Individual detectors are formed of layers of P-type and N-type semiconductor material, and are spaced apart from each other and from the readout chip by resilient electrically-insulating polymeric material which supports the detectors in their respective positions while allowing for thermally induced displacement of the detectors from their respective positions. A metallic grid on the front surface of the assembly provides a common electrical connection of the detectors to the readout chip. An antireflective coating may also be placed on the front surface of the assembly.

19 Claims, 3 Drawing Sheets

RETICULAR DETECTOR ARRAY

BACKGROUND OF THE INVENTION

This invention relates to the construction of an array of detectors suitable for imaging scenes emitting electromagnetic radiation and, more particularly, to the construction of a composite structure of a detector array and a semiconductor readout chip formed as a laminate with resilience to thermal expansion so as to permit thermal cycling for cryogenic operation without danger of inducing failures in metallic contacts between detector elements and the readout chip.

A detector array of particular interest is employed in the imaging of scenes emitting infrared radiation. Such detector arrays are operated at cryogenic temperatures, such as liquid nitrogen, during the detection of infrared radiation. Thus, there is always present a cycling of temperature between intervals of use and non-use of the infrared detector array. Such temperature cycling introduces expansion and contraction of components of the detector array, as well as in a semiconductor readout chip which is generally connected both physically and electrically to detectors of the array for extracting electrical signals from the detectors in response to the incident radiation.

One common form of construction of the infrared detector array provides for an electrically insulating substrate, such as a substrate of cadmium-zinc-telluride, upon which are grown epitaxially a P-type layer and an N-type layer of mercury-cadmium-telluride. The P-type and N-type layers of the mercury-cadmium-telluride provide a PN junction responsive to infrared radiation for introducing a current which varies in response to intensity of the radiation. The current is detected by circuitry of the readout chip. A composite construction of the laminate of the detector layers with the readout chip includes metallic contacts, typically of indium, which are located on both the detector array and the readout chip at the sites of terminals of the individual detector elements. As a practical matter in the construction of the indium contacts, the respective sets of contacts of the detector array and the readout chip are cold-welded together to form a permanent electrical and physical bond between the detector elements and the circuitry of the readout chip.

A problem arises in that the coefficients of thermal expansion of silicon, generally used in construction of the readout chip, the layers of the photodetector material and the substrate layer differ so as to introduce sufficient differential displacement between the indium contacts of the detector elements and the indium contacts of the readout chip to stress these contacts to the point of rupture. As a result, care must be employed in an environment of thermal cycling which may occur during use of the detector array so as to reduce a tendency to rupture. However, in spite of such care, contact rupture does occur with a resulting impairment of the utility of the detector array.

SUMMARY OF THE INVENTION

The foregoing problem is overcome and other advantages are provided by a construction of a composite structure of a laminated detector array and semiconductor readout chip. In accordance with the invention, individual ones of the detector elements are spaced apart and supported by a layer of resilient polymer material instead of the rigid crystalline semiconductor material employed heretofore. The polymer material envelops the indium contacts, and also surrounds the individual detector elements, except on the front face of the detector elements which is exposed to incident infrared radiation. The front faces of the detector elements contact the arms of a grid of electrically conducting material, such as metal, which forms a common return contact to the readout chip for all of the detector elements. While the polymer material has a different thermal coefficient of expansion than does silicon of the semiconductor chip, the resiliency of the polymer material absorbs any differential displacement caused by temperature variation, and thereby prevents significant buildup of stress in the indium contacts. Thus, the construction of an infrared detector array in accordance with the invention is able to withstand thermal cycling.

In accordance with a method of construction, the construction process begins by preparing a substrate of cadmium-zinc-tellurium which serves as a base upon which the detector layers are grown. In a preferred embodiment of the invention, a layer of mercury-cadmium-tellurium (HgCdTe), doped with arsenic to provide for a P-type characteristic, is grown epitaxially upon the substrate. This is followed by a further epitaxial growth of mercury-cadmium-tellurium doped with indium to provide an N-type characteristic. The foregoing two layers provide a PN junction and serve as the detector material. The detector material is then divided into an array of individual detector elements by etching troughs into the detector material all the way up to the substrate. Thereupon, the surface of the HgCdTe is covered with an insulating layer of silicon dioxide, and contact windows are etched through the silicon dioxide for subsequent contact metallization with a metal such a palladium.

The construction process continues with a building of an indium contact on each of the detector elements. Similar contacts are also provided at the terminals of a readout chip to be connected to the array of detectors. The resulting composite structure of substrate with array of detectors thereon is then electrically and physically connected to the readout chip by aligning the indium contacts of the array with the indium contacts of the chip, applying pressure and cold welding the two sets of contacts together.

In accordance with the invention, the construction process continues by filling in the voids between the readout chip and the detector array and the troughs between the detectors of the array with a resilient polymer material, such as silicone elastomer. The polymer material serves as a support and means for positioning the detectors in the array. The polymer material is electrically insulating and, therefore, serves to electrically insulate the individual detector elements from each other.

The construction procedure continues with a removal of the substrate by a milling operation or by chemical etching, the removal process being continued so as to remove a small portion of the detector material which lays at the interface with the substrate to remove any irregularities in crystal structure in the detector material. It is noted that the polymer material extends between the detectors up to the front face of the array of detectors. Thereupon, the metal grid is deposited on the front face of the array with the arms of the grid situate at the polymer material and having sufficient width to overlap edge portions of each of the detector elements to form an ohmic contact therewith. An optical coating is then deposited on the front face of the array to a depth sufficient to cover the metallic grid. A hole is etched into the coating at an edge of the grid, and an electrical conductor in the form of a wire is passed through the hole to electrically connect the grid to a terminal of the readout chip.

BRIEF DESCRIPTION OF THE DRAWING

The aforementioned aspects and other features of the invention are explained in the following description, taken in connection with the accompanying drawing wherein.

DETAILED DESCRIPTION

Figure 1:
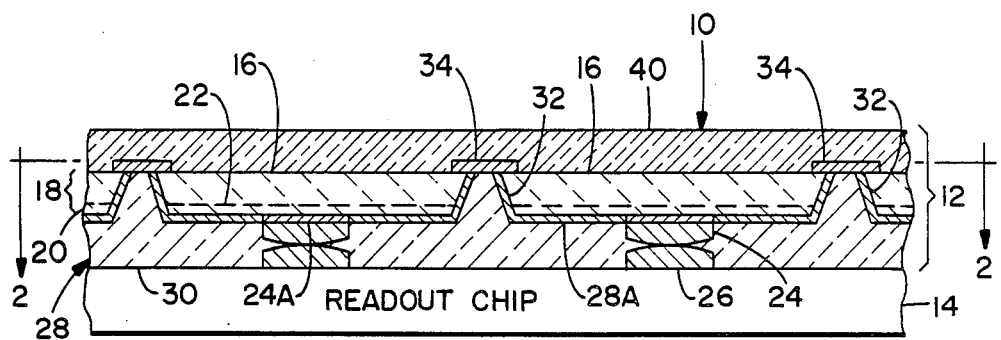
FIG. 1 shows a fragmentary view of the detector array of the invention in section, with a readout chip shown appended thereto diagramatically.
Figure 2:
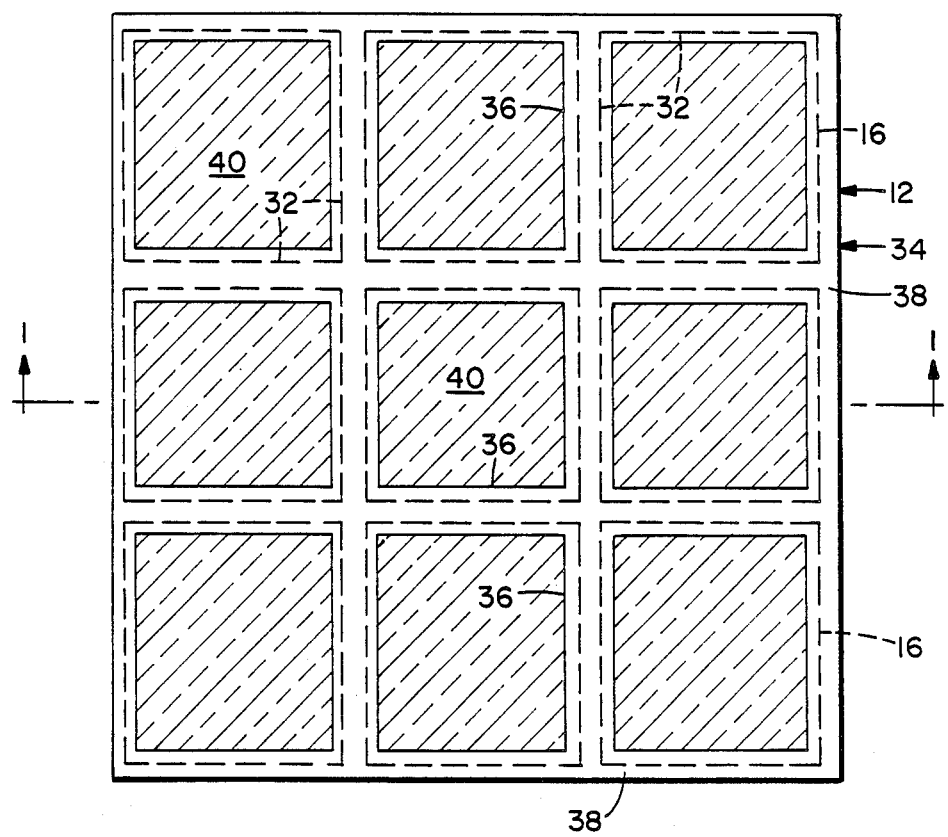
FIG. 2 is a sectional view of the detector array taken along the line 2—2 in FIG. 1 and showing a layout of detector elements of the array.
Figure 3:
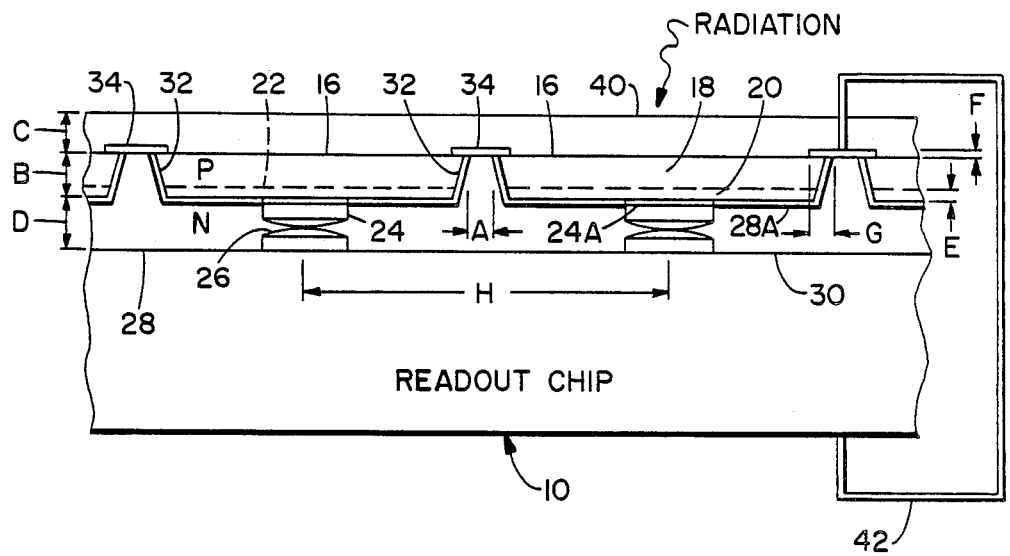
FIG. 3 is a diagrammatic view of a section of the detector array, the section corresponding to the section in FIG. 1.

With reference to FIGS. 1–3, there is shown a radiation detector assembly 10 comprising a detector array 12 disposed on a readout chip 14. The array 12 is composed of detectors 16 arranged in rows and columns. Each detector 16 includes an upper detector layer 18 and a lower detector layer 20 which meet at an interface 22 to form a PN junction at the interface 22. The terms "upper" and "lower" employed herein are in reference to the physical structure of the assembly 10 as presented in FIGS. 1 and 3, it being understood that these terms correspond to the terms "front" and "back" in which a front surface of the assembly 10 faces incoming radiation and wherein the chip 14 is located on a backside of the assembly 10. Each of the detectors 16 has the form of a diode wherein the upper layer 18 is formed of P-type material and the lower layer 20 is formed of N-type material.

A set of upper contacts 24 and a set of lower contacts 26 are provided for connecting the detectors 16 of the array 12 to the chip 14. Each of the upper contacts 24 is formed in the bottom surface of a detector 16. The lower contacts 26 are formed on the top surface of the chip 14 and located in registration with the corresponding upper contacts 24 of the detectors 16. A resilient support 28 envelops and holds the detectors 16. The support 28 is formed of a resilient polymer, such as silicone elastomer, and comprises a base 30 with divider walls 32 upstanding from the base 30. An insulating layer 28A of silicon dioxide separates the semiconductor material of each detector 16 from the support 28, and passivates the surfaces of the detector material, particularly at the PN junction at the interface 22, to prevent development of electric charge by interaction with polymer material of the support 28.

Electrical connection through the insulating layer 28A at each detector 16 is made by contact metal 24A disposed between lower layer 22 and an upper contact 24. The base 30 surrounds the lower contacts 26 and fills the space between the bottom surface of the array 12 and the top surface of the chip 14. The divider walls 32 are arranged in rows and columns between the detectors 16, and give the detectors 16 the shape of islands disposed within the support 28.

An electrically conductive grid 34 is disposed on top of the array 12. The grid 34 comprises arms 36 arranged in rows and columns disposed in registration with the divider walls 32, an outer perimeter of the arms 36 forming a frame 38. The arms 36 are sufficiently wide to overlap a marginal portion on each side of a detector 12 to form an electrically conductive ohmic contact with each detector 32. A radiation-transmissive coating 40 is disposed on the top surfaces of the detectors 12 and the grid 34 for matching the indices of refraction of air to the material of the detectors 12, thereby to optimize absorption of incident infrared radiation into the detectors 12. During use of the assembly 10 for detection of incident radiation, the top surface of the assembly 10 faces the incident radiation. A wire 42 connects through the coating 40 to the grid 34 to provide an electrical return signal path from the grid 34 to an electrical terminal of the readout chip 14.

Figure 4:
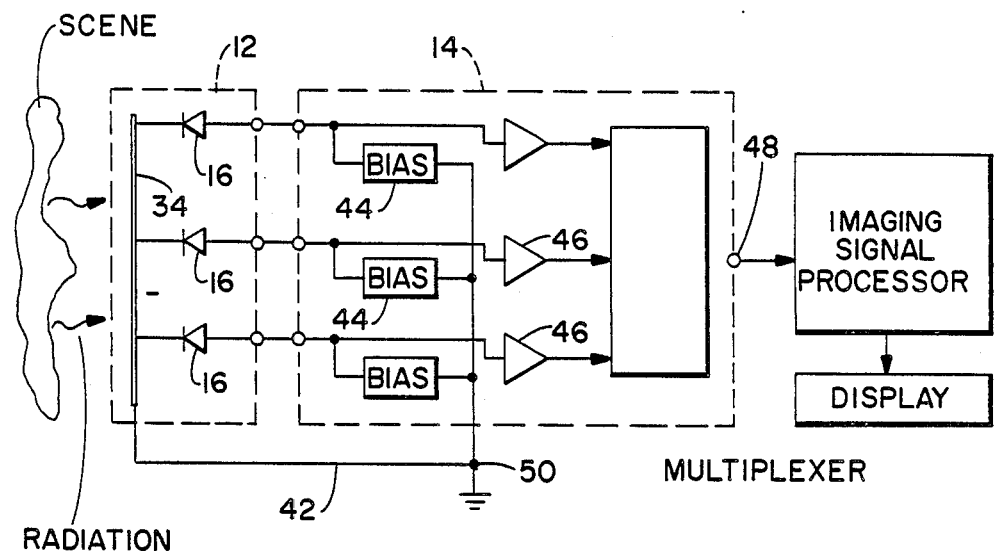
FIG. 4 is an electrical schematic diagram showing interconnection of detector elements of the array to circuitry of the readout chip.

FIG. 4 shows a simplified electrical connection between circuitry of the readout chip 14 and the detector array 12. Each of the detectors 16 are portrayed as diodes, this being the equivalent circuit of the detectors. By way of example of readout circuitry in the chip 14, a separate circuit channel is provided for each of the detectors 16, each channel comprising a bias circuit 44 and an amplifier 46. The bias circuits 44, as is well known, establish bias currents or voltages for the detectors 16, and the amplifiers 46 amplify signals outputted by respective detectors 16 in response to incident radiation. Output signals of the amplifiers 46 are multiplexed by a multiplexer, preferably formed on the readout chip 14, to appear at an output terminal 48 of the readout chip 14. If desired, the terminal of the chip 14 connected to the wire 42 may be grounded as indicated at point 50.

With respect to materials employed in the construction of the assembly 10, the readout chip 14 is formed of a semiconductor material, typically silicon. The contacts 24 and 26 are formed, preferably, of indium. The contact metal 24A is palladium, preferably. In each of the detectors 16, both the upper and the lower layers 18 and 20 are formed of mercury-cadmium-tellurium. The relative concentrations of the mercury, cadmium, and tellurium in each of the detectors 16 is selected in accordance with the wavelength of infrared radiation to be detected. The ratio is 0.7:0.3:1.0 respectively for the mercury, cadmium, and tellurium for detection of radiation having wavelengths in the range of 3–5 microns. For longer wave radiation, the foregoing ratio becomes 0.8:0.2:1.0. In the upper layer 18 of each detector, the P-type electrical characteristic is attained by using a dopant such as arsenic, the dopant concentration being $10^{(15)}$ atoms per cubic centimeter. In the lower layer 20 of each detector, the N-type electrical characteristic is attained by a dopant such as indium with a concentration of $2 \times 10^{(16)}$ atoms per cubic centimeter. The grid 34 is formed of a metal such as palladium, nickel, molybdenum or gold. The coating 40 may be formed of zinc sulfide. The polymer of the support 28 may be epoxy, polyimide or silicone elastomer.

With respect to dimensions of elements of the assembly 10, reference is made to the designations A–H in FIG. 3. The wall 32 has a width A equal to 0.2 mil.

Each detector 16 has a thickness B equal to approximately 0.5 mil. The layer of coating 40 has a thickness C which is approximately equal to one-quarter wavelength of the incident radiation, a typical value of the thickness C being 5000 angstroms. The base layer 30 of the support 28 had a thickness equal to 0.5 mil. The insulating layer 28A has a thickness of approximately 1500 angstroms. The lower layer 20 of each detector has a thickness E equal to approximately 2 microns. The arms 36 of the grid 34 have a thickness F in the range of 2000–3000 angstroms. The extension of each arm 36 of the grid 34 over the marginal region of an edge of a detector 16 produces an overlap G which is selected as a design parameter of the assembly 10 so as to provide more or less shading of a detector 16 from the incident radiation, and must have sufficient width to provide an ohmic contact between grid 34 and detector 16. In the situation wherein such shading is not required, a typical value of the overlap G is approximately 0.1 mil. The contacts 26 are spaced apart with a spacing H, which spacing is equal to the spacing of the detectors 16 on centers, the spacing H being in the range of 2–3 mils.

FIG. 4 also shows utilization of the detector array 12 and the readout chip 14 for presenting an image of a scene emitting infrared radiation on a display. The signal provided at output terminal 48 for each of the detector channels is applied to a signal processor which combines these signals in a well-known manner to provide an image of the scene, the image then being presented on the display. While only three detectors are shown in FIG. 4, it is to be understood that in practice, large arrays of 100 or more detectors may be constructed. Also, the readout chip 14 may include multiplexing circuitry (not shown) which samples sequentially signals of individual ones of the detector channels, the sampled signals then being employed by the signal processor to produce the image of the scene.

FIGS. 5A–5L show a process for constructing the assembly 10 of FIG. 1. The process begins with the preparation of a substrate 52 (FIG. 5A) of cadmium-zinc-tellurium with these elements having concentration ratios of 0.96:0.04:1.0, respectively. The substrate 52 serves as a base for the growing epitaxially of the upper detector layer 18 (FIG. 5B) by use of liquid-phase epitaxial growth of P-doped mercury-cadmium-tellurium. The process continues (FIG. 5C) with a further liquid-phase epitaxial growth of the lower detector layer 20 by use of N-type mercury-cadmium-tellurium. The deposition of the detector layers may be done also by another well-known technique vapor-phase epitaxy. The resulting structure has three layers, namely, the layer of substrate 52, and the two layers 18 and 20 of a detector 16.

Next, a set of troughs 54 (FIG. 5D) are formed within the layers 18 and 20, the troughs extending completely through both of the layers 20 and 18 up to the surface of the substrate 52. The troughs are shown only in a side view in the diagrammatic representation of FIGS. 5D–5L, it being understood that the configuration of the troughs 54 in plan view corresponds to the configuration of the divider walls 32 of FIGS. 1 and 2. The troughs 54 are formed by applying a suitable mask (not shown) to the bottom surface of the layer 20, and then directing a suitable etchant normally to the layer 20 to etch away the portions of the layers 20 and 18 which are not protected by the mask. This results in the production of the troughs 54. The troughs 54 define the detectors 16 in the array 12. It is to be understood that the diagrammatic representations of FIGS. 5D–5L show only a fragmentary portion of a complete assembly 10.

Figure 5A:
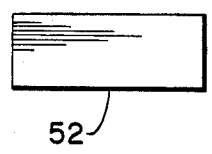
FIGS. 5A–5L taken together show steps in the fabrication of the composite inventive structure of the layers of detector material, the polymer material, and the readout chip.
Figure 5B:
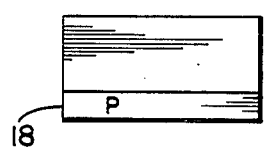
Figure 5C:
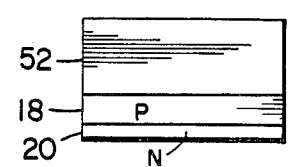
Figure 5D:
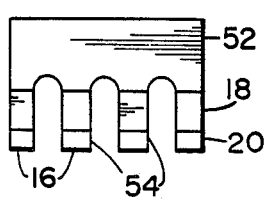
Figure 5E:
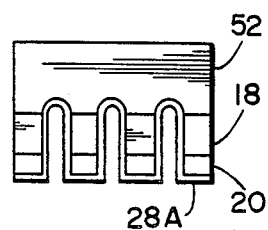
Figure 5F:
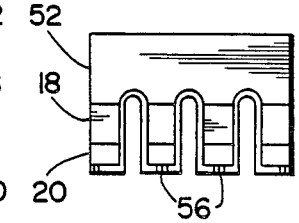
Figure 5G:
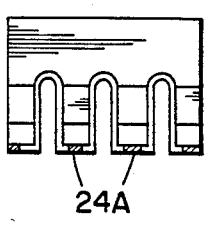
Figure 5H:
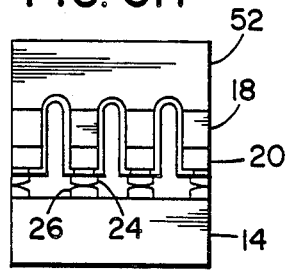

As shown in FIGS. 5E–5G, the surfaces of the troughs 54 and the exposed surface of the lower layer 20 are mated with silicon dioxide to produce the insulating layer 28A. First, the silicon dioxide is applied by chemical vapor deposition (CVD) of silane ($SiH_4$) plus oxygen which interact to leave a coating (FIG. 5E) of silicon dioxide ($SiO_2$ which forms the layer 28A. At each detection 16, a window 56 is etched through the layer 28A up to the lower layer 20 (FIG. 5F), and then the contact metal 24A is applied within each window 56 (FIG. 5G). Etching of the windows 56 is accomplished by buffered oxide etch through photoresist material having the desired window pattern. The contact metal 24A is applied by thermal evaporation of palladium over the photoresist, the resists being lifted off with acetone to leave the palladium within the windows.

The process continues with the construction of the contacts 24 and 26 (FIG. 5H) on the detectors 16 and on the readout chip 14. The chip 14 is then positioned to bring the contacts 26 of the chip 14 into alignment with the corresponding set of contacts 24 of the array of detectors 16. Thereupon, the chip 14 and the substrate 52 are urged together to compress the contacts 24 and 26 against each other to effect a cold welding of the contacts to each other as portrayed in FIG. 5H. This results in a hybrid structure of semiconductive layers and a readout chip. It is noted that in the structure of FIG. 5H, the troughs 58 and the spaces between the welded sets of contacts constitute an extensive void which is to be filled in the next step of the construction process.

Figure 5I:
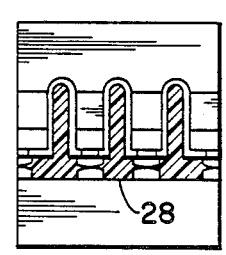
Figure 5J:
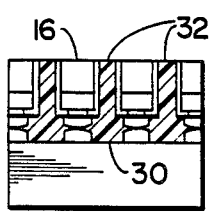

In FIG. 5I, the foregoing void is filled with the polymer material in liquid form. The polymer material is then allowed to cure and solidify to provide the support 28. The support 28 is sufficiently rigid to maintain the detectors 16 in position relative to the chip 14, but has significantly more resilience than do the contacts 24, 26 and the chip 14. The substrate 52 is now removed (FIG. 5J) by either a mechanical process such as milling or abraiding, or by a chemical process such as etching. This leaves the detectors 16 fully supported in their respective positions by the divider walls 32 and the base 30 of the support 28, in addition to the physical connection of the contacts 24 with the contacts 26. Due to the increased resilience of the support 28 relative to the chip 14, any differential expansion or contraction of the support 28 relative to the chip 14 due to changes in temperature can occur without the development of excessive stress and strain in the contacts 24 and 26. As a result, the integrity of the contacts 24 and 26 is preserved during changes in temperature. During the removal of the substrate 52, it is advantageous to remove also a small surface region of the material of the upper detector layer 18 near the interface with the substrate 52 because the region of the detector layer 18 near the interface is known to have a high defect density which, if left intact, could adversely affect performance of the detectors 16.

Figure 5K:
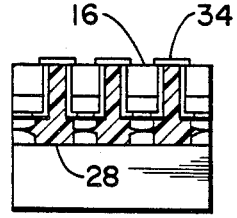
Figure 5L:
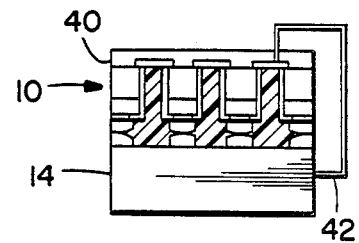

In FIG. 5K, the grid 34 is deposited on top of the upper surfaces of the detectors 16 and on top of the upper ends of the walls 32. The grid 34 is deposited by patterning a photoresist mask (not shown) on top of the detector array 16, and then, by means of well known evaporation or sputtering techniques, directing metal through the openings in the mask to form the grid 34. The mask is then removed by conventional techniques, such as etching or dissolving the mask material, to leave the structure as shown in FIG. 5K. Finally, as shown in FIG. 5L, the antireflection coating 40 is deposited on top of the mask 34 and on top of the upper or front surfaces of the detectors 16. A via is formed in the coating 40 to provide passage for the wire 52 to contact the grid 34, such contact being made preferably on the frame 38 of the grid 34. The other end of the wire 42 is connected to the chip 14 to complete the construction of the assembly 10. If desired, thermal cycling may be applied to the assembly 10. By way of example, such thermal cycling may be performed in the temperature range of 300 degrees Kelvin to 80 degrees Kelvin. As noted above, the integrity of the contacts 24 and 26, as well as the cold welds therebetween, is maintained during the temperature cycling. An advantage of the resilient support 28 is the fact that much larger arrays of detectors can be built than has been possible heretofore because the resilient support 28 can accommodate the amount of differential expansion which increases with progression away from the center of the array. Therefore, only relatively small arrays can be constructed with support systems of the prior art as compared to the resilient support of the present invention. As an example of such prior art structure, the structure of FIG. 5H, if modified to have more shallow troughs defining mesas, would be suggestive of the prior art. Therein, the excessive rigidity of the substrate 52 would introduce the unwanted stress and strain in the contacts 24, 26. However, as has been shown in the step of FIG. 5J, the substrate is removed, thereby removing the source of excessive stress and strain in the contacts 24, 26.

A further advantage of the assembly 10 of FIG. 5L is provided by the electrical resistance of the polymer material within the walls 32 of the support 28. The electrical resistance of the walls 32 eliminates a significant amount of crosstalk between signals of neighboring detectors 16 over that which has been experienced heretofore.

Thereby, as demonstrated in the foregoing construction, the assembly 10 provides for an array of detectors 16 suitable for infrared imaging, the assembly 10 being a composite structure of both the detector array 12 and the readout chip 14. The construction of the invention permits the assembly 10 to be constructed of much larger size than has been possible heretofore without the introduction of thermally induced failure of contacts between the array and the readout chip, the construction also providing the added advantage of reduced crosstalk between the detectors of the array.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A radiation detector assembly comprising:
an array of detectors disposed in spaced-apart relation along a front side of said assembly for receiving radiation incident on a front side of said detector array;
a readout chip spaced apart from a back side of said detector array;
a resilient electrically insulating support disposed as a layer between said array and said chip, and extending forward as a set of walls between detectors to a front side of said array;
a plurality of electrical contacts extending through said support from individual ones of said detectors to said chip; and
an electrically conductive grid disposed on a front surface of said array for conducting signals between said detectors and said chip, arms of the grid overlaying said support walls and extending over edge portions of said detectors to make electrical contact therewith, resilience of said support permitting a thermally induced displacement of the detectors relative to each other.

2. A detector assembly according to claim 1 further comprising an antireflective coating covering said grid and front surfaces of said detectors.

3. A detector assembly according to claim 2 wherein each of said detectors comprises a layer of P-type semiconductor material and a layer of N-type semiconductor material providing a PN junction within each said detector.

4. A detector assembly according to claim 3 wherein the semiconductor material in each said detectors is mercury-cadmium-tellurium responsive to infrared radiation.

5. A detector assembly according to claim 4 wherein the P-type semiconductor material is doped with arsenic, and the N-type semiconductor material is doped with indium.

6. A detector assembly according to claim 5 wherein said grid is an electrically conductive metal consisting of palladium, nickel, molybdenum, or gold.

7. A detector assembly according to claim 6 wherein a thickness of said support walls is less than approximately one-tenth the width of individual ones of said detectors positioned alongside said walls.

8. A detector assembly according to claim 1 wherein a thickness of said support walls is less than approximately one-tenth the width of individual ones of said detectors positioned alongside said walls.

9. A detector assembly according to claim 8 further comprising an electrical conductor extending from said grid to a terminal of said chip.

10. A detector assembly according to claim 9 wherein said support is formed of a polymer material consisting of polyimide, epoxy or silicone elastomer.

11. A method of constructing a radiation detector assembly comprising the steps of:
forming a substrate;
depositing layers of detector material epitaxially upon said substrate;
etching troughs within said detector layer to define an array of individual detectors;
connecting a readout chip via contacts to said detectors on a side of said detectors opposite said substrate;
injecting resilient support material between said contacts and within said troughs to form walls between said detectors;
removing said substrate; and
depositing an electrically conductive grid in place of said substrate, arms of said grid overlaying said walls and extending over peripheral regions of said detectors.

12. A method according to claim 11 wherein said step of depositing comprises a step of depositing a P-type semiconductor material followed by a step of depositing an N-type semiconductor material.

13. A method according to claim 12 wherein said substrate is formed of cadmium-zinc-tellurium.

14. A method according to claim 12 wherein said step of depositing P-type semiconductor material is accomplished by depositing mercury-cadmium-tellurium doped with arsenic, and said step of depositing said N-type semiconductor material is accomplished by depositing mercury-cadmium-tellurium doped with indium.

15. A method according to claim 11 further comprising a step of applying a coating to a front surface of said grid and to front surfaces of individual ones of said detectors.

16. A method according to claim 15 wherein said coating is zinc sulfide.

17. A method according to claim 11 wherein said support material is a polymer consisting of polyimide, epoxy or silicone elastomer.

18. A method according to claim 11 further comprising step of forming an insulating passivation layer within said troughs subsequent to said step of etching the troughs.

19. A method according to claim 18 wherein said insulating layer is silicon dioxide.

* * * * *